United States Patent [19]

Lo et al.

[11] Patent Number: 5,109,435
[45] Date of Patent: Apr. 28, 1992

[54] SEGMENTATION METHOD FOR USE AGAINST MOVING OBJECTS

[75] Inventors: Thomas K. Lo, Temple City; Jack M. Sacks, Thousand Oaks; Nam D. Banh, Canoga Park, all of Calif.

[73] Assignee: Hughes Aircraft Company, Los Angeles, Calif.

[21] Appl. No.: 663,786

[22] Filed: Mar. 4, 1991

Related U.S. Application Data

[63] Continuation of Ser. No. 229,196, Aug. 8, 1988, abandoned.

[51] Int. Cl.[5] .......................... G06K 9/38; G06K 9/20; H04N 7/18; H04N 5/225
[52] U.S. Cl. ........................................ 382/48; 382/50; 382/52; 358/105; 358/125
[58] Field of Search .................... 382/48, 50, 52, 1; 358/105, 108, 125, 126, 139; 342/93, 351

[56] References Cited

U.S. PATENT DOCUMENTS

| | | | |
|---|---|---|---|
| 4,409,661 | 10/1983 | Romanski | 358/125 |
| 4,489,319 | 12/1984 | Hansen | 342/93 |
| 4,639,774 | 1/1987 | Fried | 358/105 |
| 4,710,809 | 12/1987 | Ries et al. | 358/105 |
| 4,737,847 | 4/1988 | Araki et al. | 358/105 |

OTHER PUBLICATIONS

Webster's Ninth Collegiate Dictionary, p. 119, 1985.
Soviet Inventions Illustrated, Week 8741, Oct. 1987 Derwent Publications Ltd., London, GB.
Naqvi, "An application of Median Filters to Digital TV", ICASSP Proceedings, Apr. 1986, vol. 4, pp. 2451-2452.
Bernat, "Comparison of Three Motion Detection Techniques" Optical Engineering, vol. 27, #7, Jul. 1988, pp. 524-527.

*Primary Examiner*—Leo H. Boudreau
*Assistant Examiner*—Michael R. Cammarata
*Attorney, Agent, or Firm*—C. D. Brown; R. M. Heald; W. K. Denson-Low

[57] ABSTRACT

Three image frames containing an object of interest and background clutter are taken at successive time intervals and stored in memory. The background of images A, B and C are registered preferably using an area correlator 12. A median filter 16 is used to select a median value from the registered image frames. Then, subtractor 18 serves to subtract the median pixel values from one of the image frames. This difference output is then thresholded to provide a binary signal whose pixel values exceeding the threshold levels are generally associated with the position of the moving object.

17 Claims, 5 Drawing Sheets

SEGMENTATION METHOD FOR USE AGAINST MOVING OBJECTS

This is a continuation of application Ser. No. 229,196 filed Aug. 8, 1988, now abandoned.

BACKGROUND OF THE INVENTION

1. Technical Field

This invention relates to image processing and, more particularly, to techniques for detecting moving objects in cluttered scenes.

2. Discussion

A segmentation method is disclosed here which is employed primarily for the acquisition of moving objects, and is particularly applicable to those situations where the signature of the object is wholly or partially obscured by background clutter. This segmentation method also has application to the tracking and aimpoint selection functions of an acquired object.

Basically, automatic or autonomous acquisition is a detection problem. As is well known to those skilled in the art, the two most important considerations in any detection process are false detections (FDs) and missed detections (MDs). It is the goal of any competent designer of detection circuits or systems to minimize the probabilities of FDs and MDs, since the occurrence of either can cause a malfunction in the system which employs the process and thereby seriously reduce its cost-effectiveness.

In general, FDs and MDs trade off against each other; a decrease in the false alarm rate can usually be achieved at the cost of an increase in the frequency of missed detections, and vice versa. Given an irreducible lower bound in performance level achievable by a particular detection method, it is the function of the system designer to perform the trade off so as to achieve maximum effectiveness of the system within imposed constraints.

Quite often the application of predetection or post-detection processing can enhance the detection process. For instance, one can adjust parameters to allow a greater frequency of FDs in order to reduce the probability of MDs, and then resort to post-detection methods (computer algorithms, for instance) to reduce the FD rate.

SUMMARY OF THE INVENTION

This invention finds particular utility for use in applications where an imaging sensor is employed. This type of sensor, which can be either visual or infrared, produces real time two dimensional imagery (brightness as a function of two spatial dimensions). False detections and missed detections occur because of the presence of background clutter and/or random noise. The present invention is particularly effective against background clutter, and does not significantly degrade signal-to-noise ratio as do prior art moving target segmentation methods.

According to the present invention, the background of at least three image frames are registered together, preferably by an area correlator. A median value for each pixel position of the registered images is selected. Then, the median pixel values are subtracted from pixel values in one of the image frames to form a difference image. Preselected threshold values are applied to the difference image whereby pixel values exceeding a given threshold level are associated with the position of the moving object.

BRIEF DESCRIPTION OF THE DRAWINGS

The various advantages of the present invention will become apparent to one skilled in the art after reading the following specification and by reference to the drawings in which.

DESCRIPTION OF THE PREFERRED EMBODIMENT

Video image segmentation is undoubtedly the most challenging of all the problems facing image processing system designers. Segmentation is particularly difficult when the objective is to separate objects of interest from severe background clutter.

Conventional segmentation methods produce a binarized target image by comparing a video signal to either a fixed threshold or an adaptive threshold derived from samples of local target and background data. This process is necessarily subject to segmentation errors. For instance, a bilevel image may be created which may not be representative of the desired object as a whole. There is also the likelihood that intolerable amounts of clutter will be binarized along with the object. These segmentation errors can produce an excessive number of false detections when attempting to acquire an object in clutter. These errors can also cause loss of lock during midcourse tracking, and may also be responsible for poor terminal aimpoint selection.

In selecting criteria on which to base a threshold derivation, a designer is usually trapped between conflicting limitations. If the threshold is weighted too heavily toward the background (a "low" threshold), excessive digitization of clutter may occur. On the other hand, if the threshold is set too "high", a loss of digitized target pixels may result. Either of these may produce undesirable consequences.

Several approaches have been suggested to cope with this problem, including the use of histograms for threshold derivation. The histogram approach has yielded significant performance improvements in certain specific applications.

Other proposals have suggested the inclusion of sophisticated pre-binarization and post-binarization filters for clutter and noise reduction. The use of special algorithms specifically designed for post-binarization clutter reduction has also been employed in the past.

The method of the preferred embodiment of this invention includes functional means specifically intended to stabilize a scene in the field of view, or at least to bring three temporally separated lines (or frames, as the case may be) into spatial alignment and registration.

There are at least two ways to achieve this result. One method is to employ an inertially stabilized platform. A second and preferred method would employ area correlation or some form of feature matching to determine the spatial displacement between frames (or lines). This information would be used to electronically register the frames. Basically, this approach involves a simple exercise in addressing video samples stored in frame memories.

Figure 1:
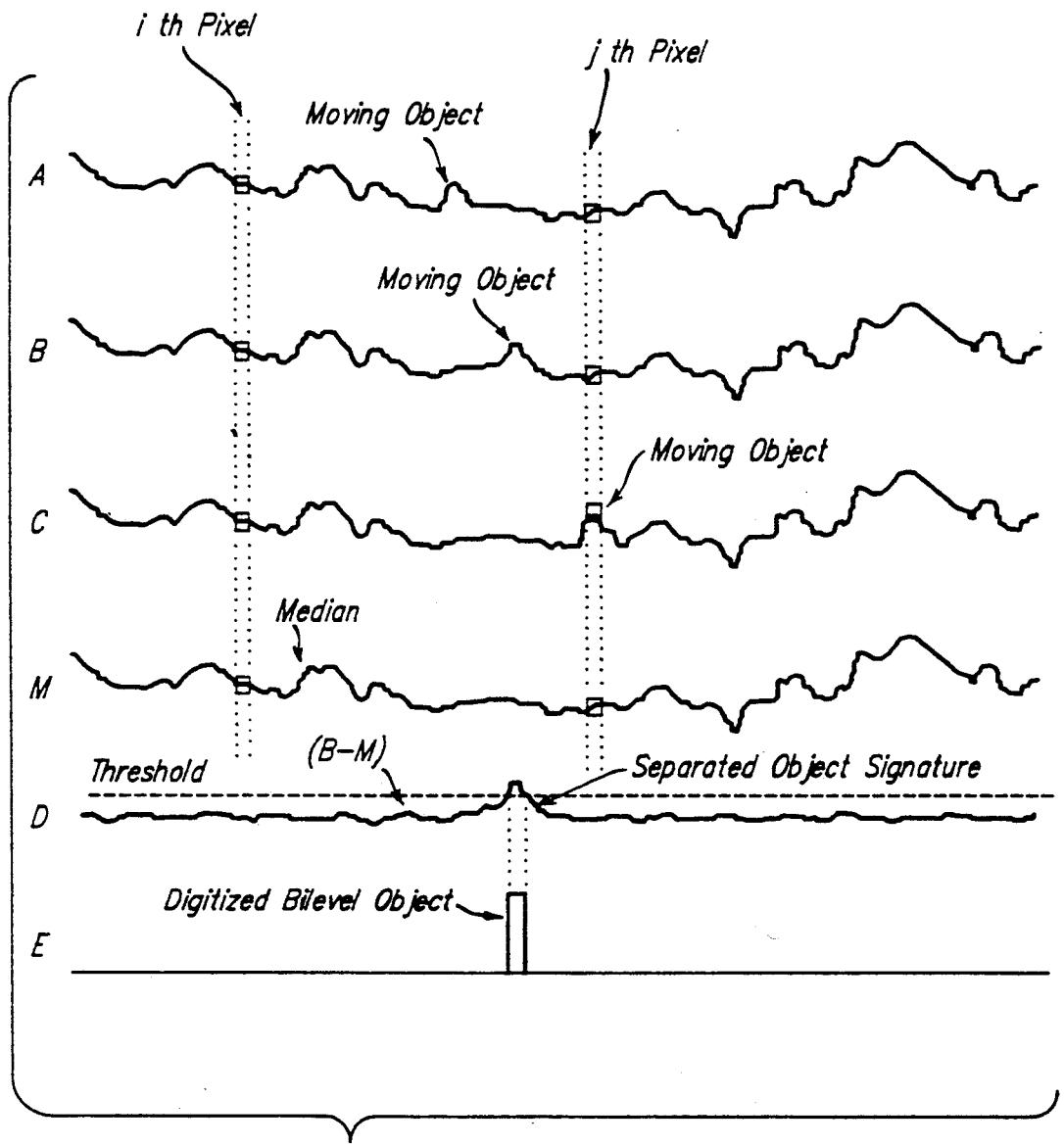
FIG. 1 is a chart useful in understanding the present invention.

FIG. 1 is a diagram which illustrates how the new method would extract a moving object from severe clutter, so that it can be unambiguously binarized. In this case the object is small, so that the example can be considered to be illustrative of the segmentation process as it might be applied in an autonomous acquisition process. Clearly, the purpose is to segment the desired object with a minimum false detection probability.

In order to achieve clarity of explanation, we shall consider single lines of video in this example rather than whole frames or fields. The case of video frames (three dimensions) will be illustrated and discussed later in connection with the functional block diagram of the preferred embodiment.

A, B, and C represent temporally separated lines of video, each of which contains a complex cluttered background and a small, low intensity object of interest. Since we have assumed that the object is moving, it will appear in a different position on each line with respect to the cluttered background. Since the brightness variations of the background clutter objects are comparable or even greater than that of the desired object, one would experience difficulty in unambiguously segmenting such an object by conventional thresholding means.

The lines are purposely drawn as being in accurate registry, that is to say that insofar as the background clutter is concerned, the lines are in horizontal alignment in the drawing. This is not a precondition imposed on real world raw data, but rather represents the results of applying the scene stabilization process which was referred to previously.

In this example, the object of interest is shown to be moving so fast that there is no spatial overlap between its signatures on successive lines. Although this condition is ideal, a partial overlap would be acceptable providing that a sufficient segment of the signature remains non-overlapped. In essence, this imposes constraints on the minimum acceptable resolution of the sensor and the bandwidth of its associated electronics, since a lack of resolution will have the effect of degrading the signal to noise ratio of the non-overlapped fraction of the object, which is the only part of its signature which will remain to be binarized. Alternatively, one can execute the process by accepting longer time delays between lines A, B, and C.

Assuming that all three lines are simultaneously accessible (a valid assumption if all three are stored in individually addressable memories), each line can be simultaneously sampled on a pixel by pixel basis. That is to say, a sample from each line, such as the "i th", is available for processing at any given instant of time. Thus, at each instant, three samples will be available, one from each line, and because of the imposed scene registry, each group of three samples will be taken at the same background location.

In those parts of the scene where the object of interest does not appear on any of the three lines (the i th pixel position, for example), the values in each group will be the same, at least to within the level of the accompanying noise. If the signatures of the objects of interest do not overlap, as is the case here, two of the three samples (the background samples) will be substantially equal even if the object of interest is sampled on one of the lines (the j th pixel position).

Now consider the median value of each group of three samples. Because of the scene registration, the value of the object sample will never be the median, even where the object is present on one of the lines (unless the object of interest and the background happen to have the same intensities, in which case the object will be undetectable). Except for noise, the median value will nearly always be the value of a background sample, regardless of the clutter.

The process of determining the median of a group of values is one of sorting or selection, and the functional component which performs the median selection is known as a "median filter". Such filters are well known to those skilled in the art of image processing and may be implemented in hardware or software form.

Line M shows the result of performing a median filtering operation at each pixel position of A, B, and C. In the idealized case depicted here, line M will be a perfect reconstruction of the background (at least to the extent that noise allows). The important point is that the signature of the object of interest will not appear anywhere on line M.

Line D shows the result of subtracting line M from line B. Except for the inevitable presence of noise, line D will contain only the object signature of line B, in splendid isolation from any trace of background or clutter. Line D can be referred to as the "antimedian" of A, B, and C.

In order to segment or binarize the target signature, a threshold level is shown applied to D (thresholding is normally accomplished in an amplitude comparator circuit or component). This threshold is fixed at a multiple of the noise level, such as 3 sigma. Whenever the signature of the object of interest exceeds the noise based threshold, a pulse will appear at the comparator output terminal, as shown in E. This pulse signifies the detection of a probable object of interest at that location. In order to be able to detect both bright and dark objects, a pair of thresholds should be employed, one positive and the other negative. Since the average value of line D is zero (exclusive of the object signature), these thresholds can be symmetrically referenced to zero.

Threshold values other than 3 sigma could be applied just as easily. A lower threshold will decrease the probability of a missed detection, at the cost of a higher false detection probability, and vice versa. Since false detections are a consequence of the presence of random noise, confirmation logic based on the persistence of detection at a particular location can be effective in reducing the false detection probability for a given signal to noise ratio or missed detection probability.

Since the background and clutter content of lines A, B, and C are identical (at least in this example), line M could have been just as effectively subtracted from line A or line C. As a matter of fact, in some real applications, the subtraction of line M from line C (the latest line) would be preferable for reasons of seeker loop stability (where unnecessary processing delays are to be avoided).

Figure 2:
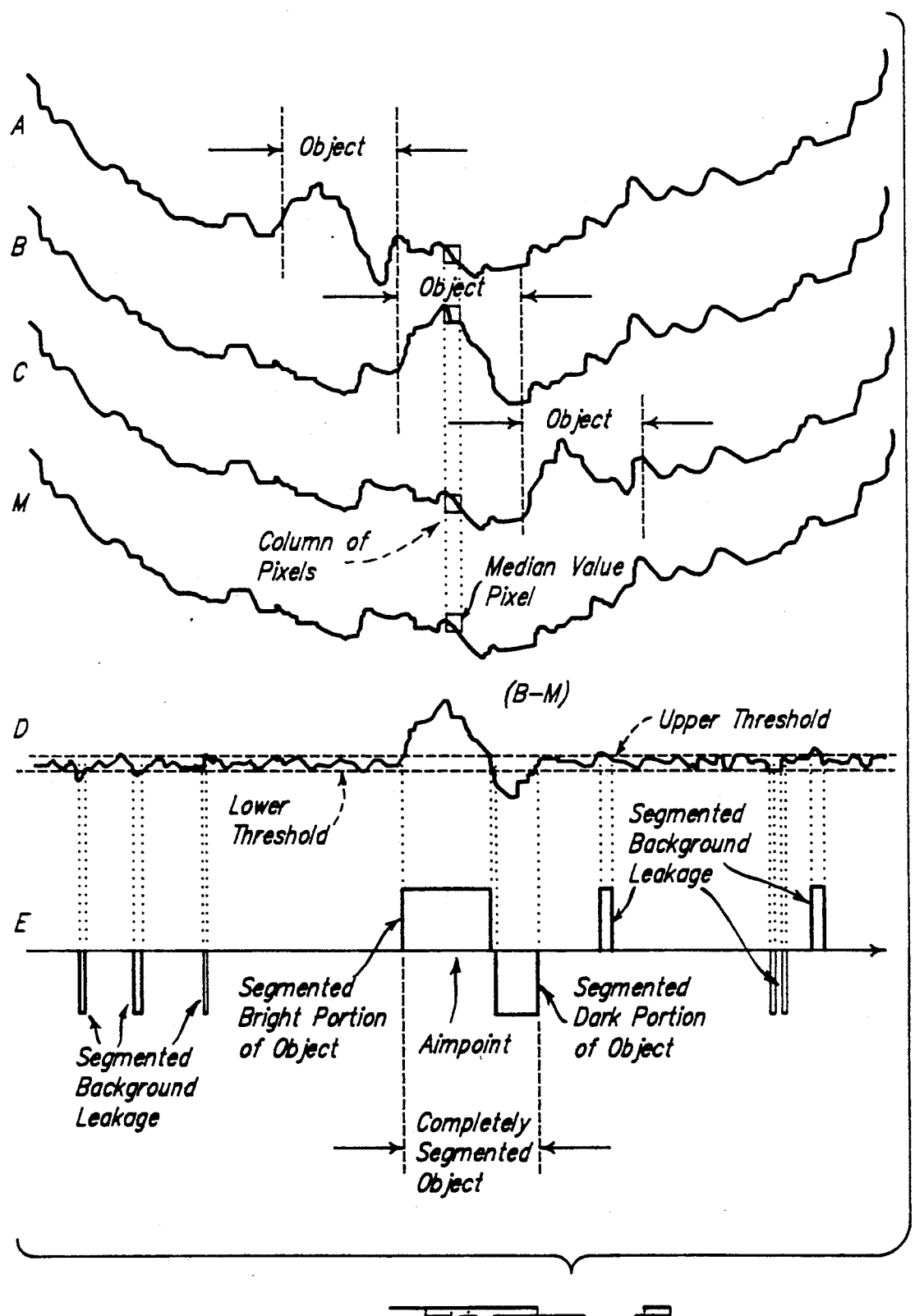
FIG. 2 is another chart useful in understanding the present invention.

FIG. 2 illustrates the same process, but here the desired object is substantially larger than the one in FIG. 1. The objective here is to illustrate how the new segmentation method can be applied to the aimpoint selection problem. This process can be particularly useful if the means employed to segment the object of interest for tracking purposes cannot be depended upon to segment the whole object or a substantial part of it. A "hot spot" tracker is an example of a tracker which is relatively efficient at tracking in the presence of clutter, but is poor in terms of effective aimpoint selection.

As before, lines A, B, and C are background-registered lines of video which contain a moving object of interest. Line M is the median of A, B and C. Line D is the antimedian obtained by subtracting M from B. The noise is exaggerated in D to illustrate the effects of noisy background "leakage", as shown in line E.

Positive and negative thresholds are shown applied to the median signal of line D; thus both bright and dark portions of the desired object signature will be binarized. The aimpoint can be computed as the arithmetic or geometric centroid of the completely segmented object, as shown in E.

The effects of background leakage can be reduced or eliminated by employing confirmation logic as previously described, or by implementing a pulse width discriminator to eliminate the detection of narrow noise pulses.

Figure 3:
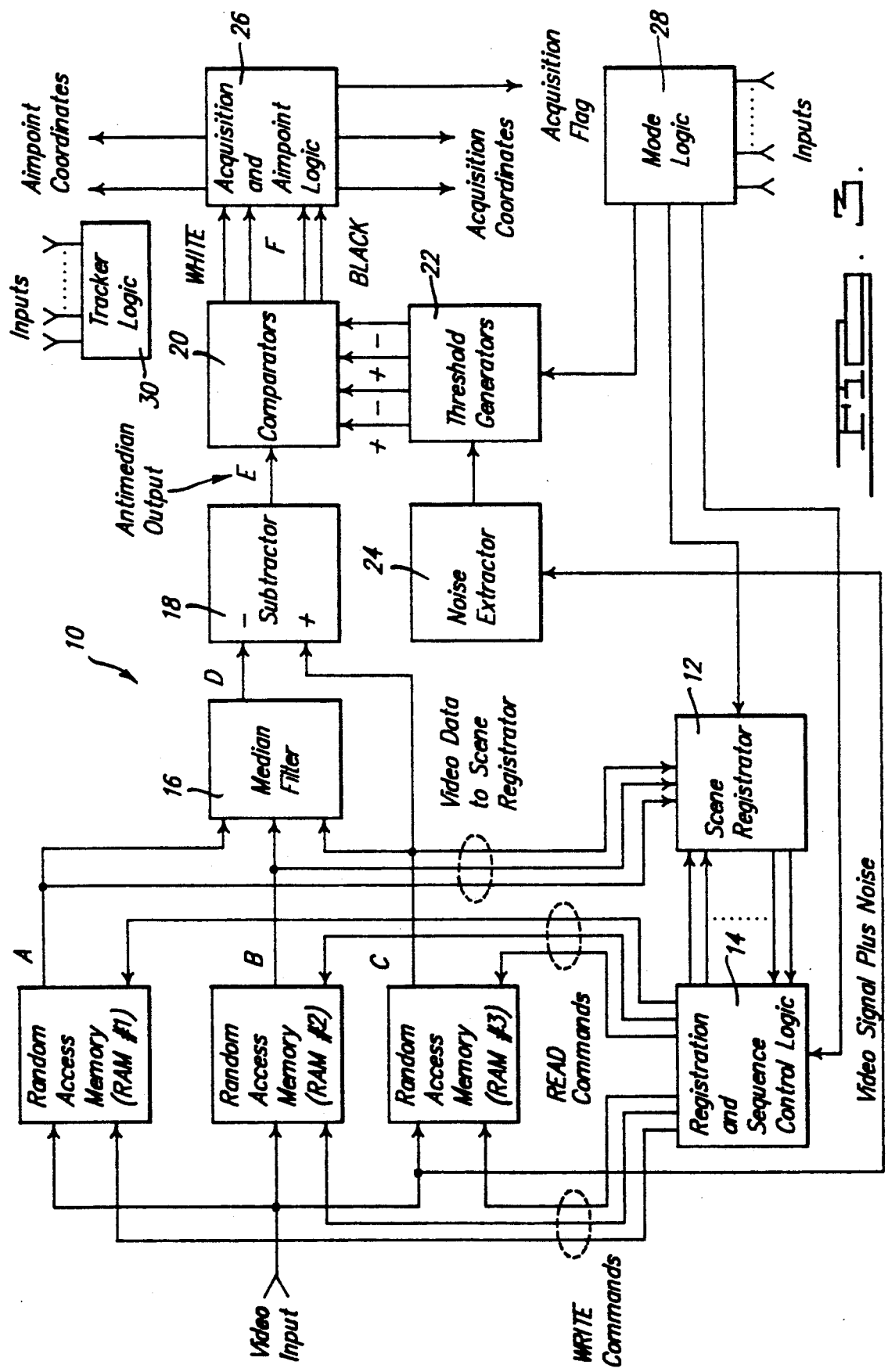
FIG. 3 is a functional block diagram of a system for carrying out the preferred embodiment of the present invention.

FIG. 3 is a functional block diagram of a preferred embodiment of the segmentation processor 10. The video signal, which is assumed to have been converted from analog to digital greylevel form, is stored in one of three frame stores, labeled Random Access Memories RAM#1, RAM#2, and RAM#3. These memories are "tri-ponged" which is to say that one frame of data is stored in RAM#1, the next frame to be processed is stored in RAM#2, and the next frame in RAM#3, after which the storage cycle repeats in groups of three.

Simultaneously with the storage process, each of the three frames is read out; sample by sample, into Scene Registrator 12, where the displacements between the backgrounds of the three frames of each group are computed. From these computed displacements, offset "readout" addresses are computed in the Registration and Sequence Control Logic 14 for each of the three frames in a group. These offset readout addresses represent the displacements in frame space required to access the samples of each of the three frames of a group in spatial registry. Ordered "write" addresses and commands to RAM#1, RAM#2, and RAM#3 are also supplied by logic 14.

The Scene Registrator 12 may contain either an area correlator (template matcher) or a feature matcher. A multicell area correlator of the type which is well known and widely used would be particularly effective in this application.

The registered contents of RAM#1, RAM#2, and RAM#3 are delivered, sample by sample, to the Median Filter 16. The readout lines are labeled A, B, and C respectively. The output of Median Filter 16 is a sequence comprising the median values of the registered background scenes in the frame stores; this sequence which may be thought of as a "frame" of median background samples, will contain mostly background values and be relatively free of samples of the desired objects. If the speed of the desired object is so great that there is no overlap of its signature between the frames of a group, the samples on line D will not contain any object of interest data at all.

Together with the registered frame information from RAM#3 on line C, the samples on line D enter the Subtractor 18 where the sample differences (C−D) are computed. These values, which comprise a sequence of antimedian samples in frame format, appear in Line E.

Line E carries the antimedian values to a group of four Comparators 20, in which the object signature segmentation or binarization is actually performed. In two of these comparators the video samples are compared to positive thresholds so that bright pieces of the object signature are binarized (by arbitrary definition, "bright" video features are assigned a positive value, and "dark" video a negative value). The other two comparators binarize the dark parts of the object by comparing the video samples with a negative threshold.

The Threshold Generators 22 generate the positive and negative digital values to which the digital antimedian samples are compared in comparators 24. Noise Extractor 24 performs the function of extracting the random noise component from the digital video input signal. There are several well known methods for performing this function. A particularly simple and effective one relies on the high degree of spatial correlation which exists between the adjacent scanned lines of virtually all natural and man-made scenes in televised images. If adjacent pairs of scanned lines are differenced, video components will be substantially eliminated from the difference signal, leaving mostly the sum of the uncorrelated noise power components present in the original lines. Assuming stationarity over a line pair, the noise amplitude of the difference signal will be equal in amplitude to the noise in either original scanned line multiplied by the square root of 2. Thus the signal which appears at the output of noise extractor 24 will track the noise level of the video input, but with a fixed 3 dB. increase over the noise.

Employing rectification, scaling, and smoothing, the four thresholds are derived in threshold generator 22 using this noise dependent signal. Two of these thresholds, one positive and the other negative, are scaled for optimum object detection. The scaling is such that the thresholds are biased toward the object's peak(s) in order to minimize the false detection probability.

The other positive-negative pair of thresholds is scaled so as to lie as close to the noise level as practical. The purpose is to binarize the maximum number of object pixels consistent with a not unreasonable number of noise pulses.

An alternate technique would employ peak detection in place of the noise-based thresholds. Peak detection would produce a lower false alarm rate for a given detection probability because the detection would take place at the highest level on the object—as far removed from noise peaks as possible.

The four bilevel signature components (black and/or white) appear at the outputs of comparators 20 on lines F, where they enter the Acquisition and Aimpoint Logic 26. Here, the coordinates of the newly acquired object of interest and the coordinates of a preferred aimpoint are both computed. An acquisition "flag" is generated which confirms that a probable object of interest has been detected and acquired.

Mode Logic 28 supervises the operation of the entire system. This functional subsystem receives inputs from a number of the previously described functional blocks and in turn supplies command and control signals to registrator 12, logic 14, generator 22, aimpoint logic 26 and tracker logic 30.

Tracker Logic 30 is a computer which receives the aimpoint coordinates, the acquisition coordinates, and the acquisition flag from aimpoint logic 26 and appropriate command and control signals from mode logic 28. From these, line of sight rates and object image growth rates are computed and supplied to the seeker as required.

Figure 4:
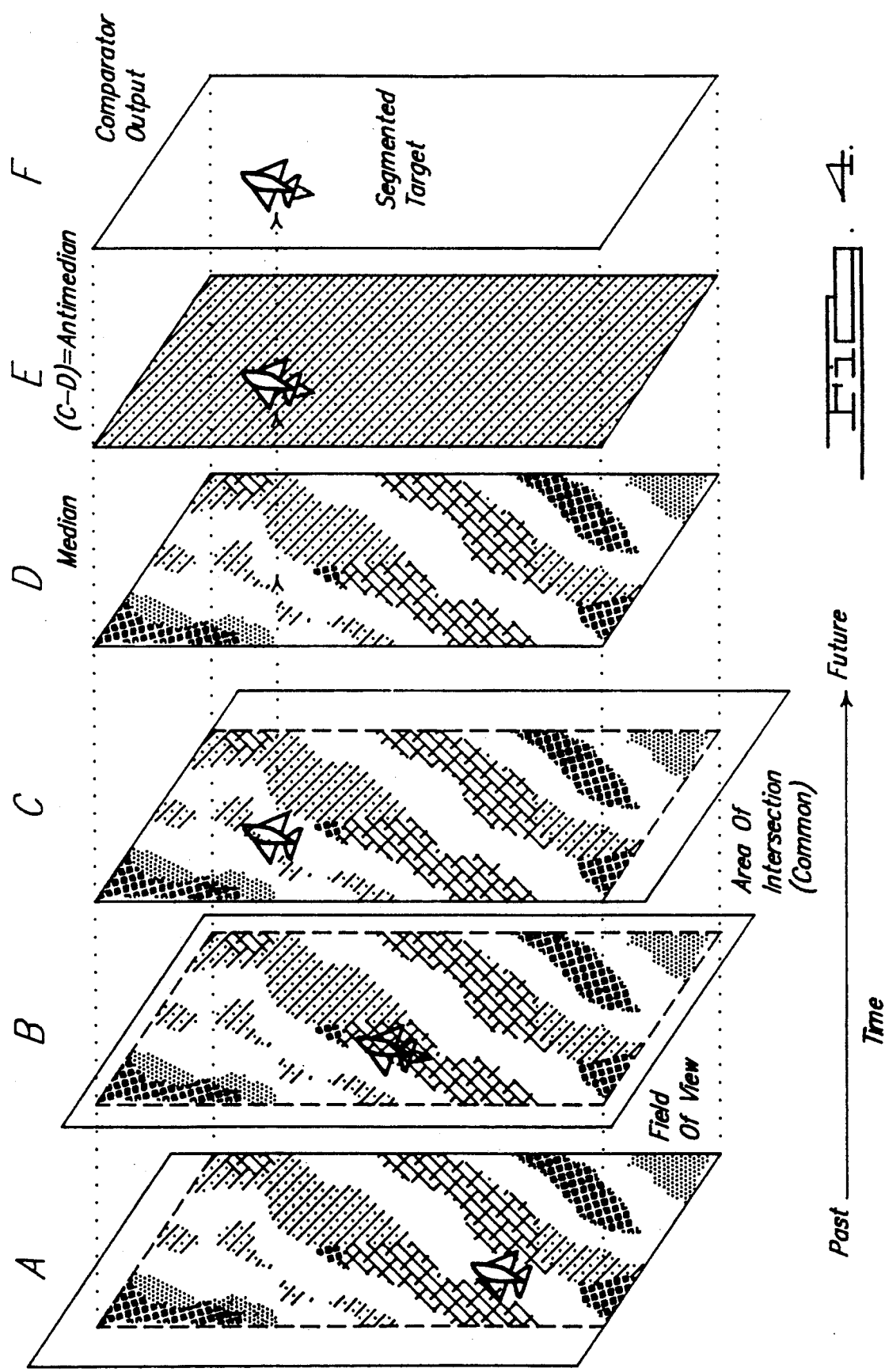
FIG. 4 comprises pictorial illustrations of images useful in understanding the present invention.

FIG. 4 illustrates the operation of the system with two dimensional video data. It depicts an aircraft flying over cluttered terrain of such complexity that conventional segmentation means could not be reliably employed. With respect to the background, the field of view is shown moving down and to the right. The aircraft is shown flying up and to the right with respect to the terrain so that the pre-acquisition motions of the hypothetical seeker containing the present invention would be independent of aircraft motion, just as in the real world.

A, B, and C represent three frames of video data. The three frames need not be temporally adjacent; the actual period between chosen frames should be chosen so that the motion of the aircraft with respect to the background is sufficient to prevent total aircraft signatures overlap in the background-registered images. On the other hand, the interframe period should not be so great that the area of background overlap is too restrictive so that the effective field of view is substantially reduced, since background suppression takes place only in the effective field of view. The actual field of view is shown enclosed in the solid lines, whereas the effective field of view is enclosed in the dashed lines of A, B, and C.

D shows an image which is constructed from the sample by sample median values of A, B, and C. As can be seen, it contains background only. E is an "antimedian" image formed by subtracting the median image D from frame C. It contains aircraft samples only. The entire aircraft image is visible in a grey (zero level) background including the jet plume.

Figure 5:
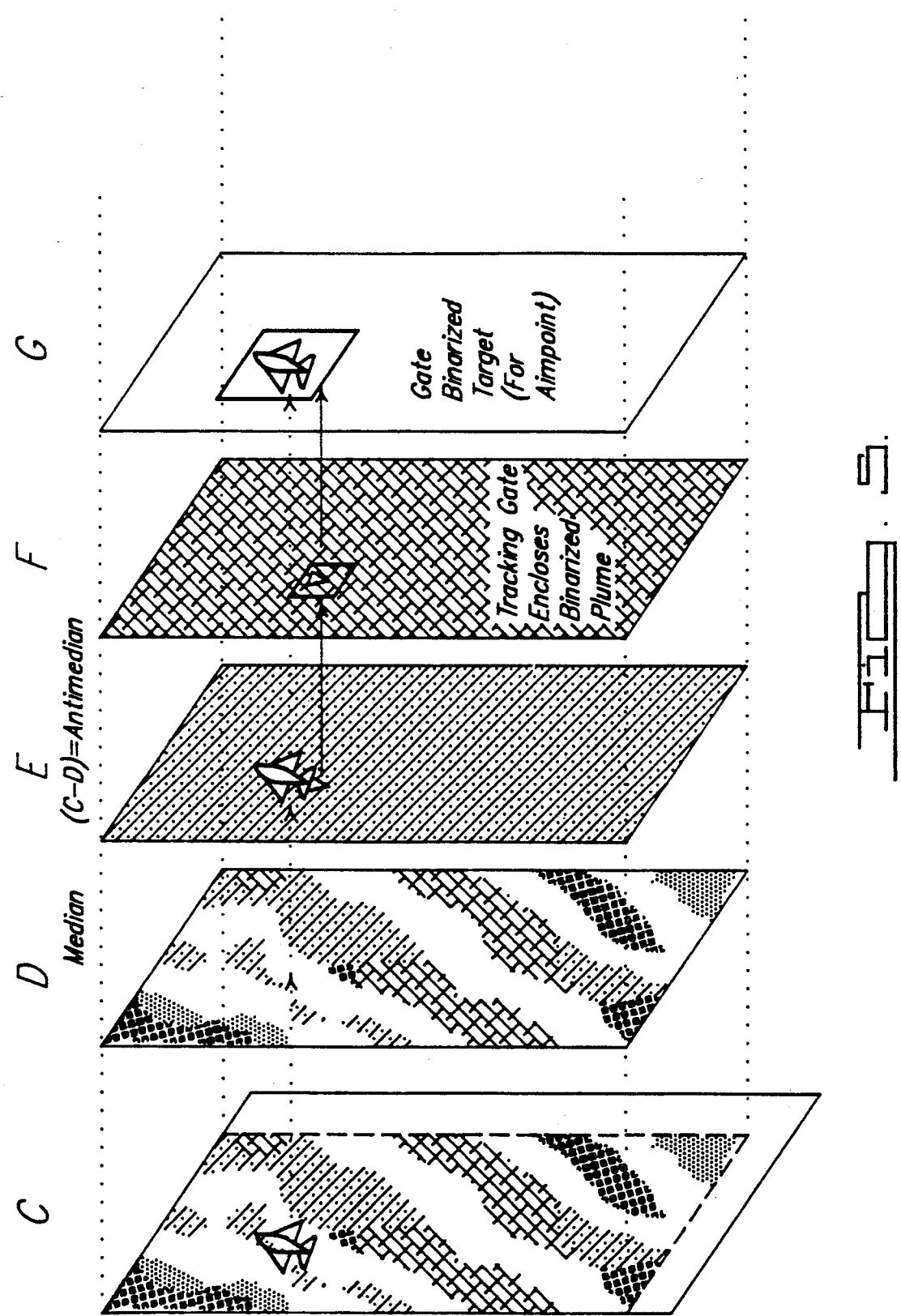
FIG. 5 comprises other pictorial illustrations of images useful in understanding the present invention.

F shows the entire segmented aircraft signature after binarization, including the plume. If desired, the dark aircraft silhouette and the bright plume could be segmented separately, as shown in FIG. 5. In this case the bright plume could be reliably acquired and tracked, while the dark aircraft signature would provide a good offset aimpoint.

Because median filtering can be shown to reduce noise almost as effectively as averaging, the new method is superior to conventional moving target detection systems which employ simple image subtraction, in which the signal to noise ratio is degraded by the process.

Another advantage of the new process is that only a single image of the aircraft remains after separation from the background, whereas conventional image subtraction leaves two images of opposite polarity, thus requiring additional logic based on external criteria to decide which aircraft image is the correct one.

What is claimed is:

1. A method of detecting a moving object in a plurality of image frames taken at different times, each image frame containing the object and background clutter, the method comprising the steps of:
   a) registering the background of at least three image frames;
   b) determining a median pixel value for each pixel position of the registered image frames to construct a registered image frame representative of only the background of the three image frames without the object;
   c) subtracting the median pixel values from pixels in a selected one of the image frames to form a difference image; and
   d) applying a threshold to the difference image whereby pixel values exceeding a given threshold level are associated with the position of the moving object.

2. The method of claim 1 wherein the threshold level is fixed at a given multiple of noise in the image frames.

3. The method claim 1 wherein the difference image is thresholded against positive and negative threshold levels, with pixel values above the positive threshold level generally being associated with bright portions of the object while pixel values below the negative threshold are generally associated with dark portions of the object.

4. The method of claim 3 which further comprises: calculating an aimpoint from the combined bright and dark portions of the detected object.

5. The method of claim 4 wherein the aimpoint is calculated from the centroid of the combined bright and dark portions of the object.

6. The method of claim 1 wherein said selected image frame is an image frame most recently taken from a sensor.

7. The method of claim 1 wherein step a) is performed using an area correlator.

8. The method of claim 1 wherein the difference image is applied to two pairs of positive and negative threshold levels, one pair of thresholds being scaled for optimum object of interest detection while another pair is scaled so as to lie as close to the noise level in the image frames.

9. A method of detecting moving objects in cluttered images, said method comprising the steps of:
   a) sensing a first scene at a given time which contains the moving object and background and storing the first scene in a memory;
   b) sensing substantially the same scene at a subsequent time and storing it as a second image frame in a memory;
   c) sensing substantially the same scene and storing it as a third image frame in a memory;
   d) using an area correlator to substantially register the image frames;
   e) selecting a median pixel value for each pixel position of the registered image frames to construct a registered image frame representative of only the background of the of three image frames without the object;
   f) subtracting the median pixel values from pixel values in the third image frame to thereby form a difference image; and
   g) generating a binary output signal by thresholding the difference image against preselected positive and negative threshold levels chosen as a function of noise in the image frames whereby pixel values in the difference image exceeding the positive and negative threshold values are generally associated with dark and bright portions of the moving object, respectively.

10. The method of claim 9 which further comprises: calculating an aimpoint from the centroid of the dark and bright portions of the moving object as represented in the binary output signal.

11. Apparatus for detecting a moving object in a plurality of image frames taken at different times, each image frame containing the object and background clutter, the apparatus comprising:
   means for registering the background of at least three image frames;

means for determining a median pixel value for each pixel position of the registered images to construct a registered image frame representative of only the background of the three image frames without the object;

means for subtracting the median pixel values from pixels in a selected one of the image frames to form a difference image; and means for applying a threshold to the difference image whereby pixel values exceeding a given threshold level are associated with the position the moving object.

12. The apparatus of claim 11 which further comprises:

means for defining a positive threshold level;
means for defining a negative threshold level; and
wherein the difference image is thresholded against the positive and negative threshold levels, with pixel values above the positive threshold levels generally being associated with bright portions of the object while pixel values below the negative threshold are generally associated with dark portions of the object.

13. The apparatus of claim 12 which further comprises:

means for calculating an aimpoint from the combined bright and dark portions of the detected object.

14. The apparatus of claim 13 wherein the means for calculating includes:

means for calculating the centroid of the bright portion of the object; and
means for calculating the centroid of the dark portion of the object.

15. The apparatus of claim 11 wherein said means for registering comprises an area correlator.

16. The apparatus of claim 11 wherein said means for applying a threshold comprises:

first positive threshold means for defining a first positive threshold level that is scaled to optimize detection of the object of interest;
first negative threshold means for defining a negative threshold level that is scaled to optimize detection of the object of interest;
second positive threshold means for defining a second positive threshold level close to the noise level in the image frames; and
second negative threshold means for defining a second negative threshold level that is scaled close to the noise level in the image frames.

17. The apparatus of claim 16 wherein said second positive threshold means and second negative threshold means define threshold levels which are a given multiple of the noise in the image frames.

* * * * *